United States Patent
Dirksen et al.

(10) Patent No.: US 9,550,211 B2
(45) Date of Patent: Jan. 24, 2017

(54) TEMPERATURE COMPENSATION IN A CMUT DEVICE

(75) Inventors: Peter Dirksen, Eindhoven (NL); Adriaan Leeuwestein, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 199 days.

(21) Appl. No.: 14/006,972

(22) PCT Filed: Apr. 6, 2012

(86) PCT No.: PCT/IB2012/051719
§ 371 (c)(1),
(2), (4) Date: Sep. 24, 2013

(87) PCT Pub. No.: WO2012/140556
PCT Pub. Date: Oct. 18, 2012

(65) Prior Publication Data
US 2014/0022865 A1  Jan. 23, 2014

(30) Foreign Application Priority Data
Apr. 13, 2011  (EP) .................................... 11162282

(51) Int. Cl.
*B06B 1/00* (2006.01)
*B81B 3/00* (2006.01)
*B06B 1/02* (2006.01)

(52) U.S. Cl.
CPC .............. *B06B 1/02* (2013.01); *B06B 1/0292* (2013.01); *B81B 3/0081* (2013.01); *Y10T 29/49005* (2015.01)

(58) Field of Classification Search
CPC ........ B06B 1/02; B06B 1/0292; B81B 3/0081; Y10T 29/49005
USPC .......................................................... 367/181
See application file for complete search history.

(56) References Cited

U.S. PATENT DOCUMENTS

| 3,715,638 | A | * | 2/1973 | Polye | G01L 9/0075 257/419 |
| 4,016,764 | A | * | 4/1977 | Rice | G01L 9/0072 361/283.4 |
| 5,195,373 | A | * | 3/1993 | Light | G10K 11/004 310/327 |
| 2005/0046311 | A1 | | 3/2005 | Baumgartner et al. | |

(Continued)

FOREIGN PATENT DOCUMENTS

| CN | 101878658 A | 11/2010 |
| CN | 101969856 A | 2/2011 |

(Continued)

OTHER PUBLICATIONS

International Preliminary Report on Patentability, International Bureau of WIPO, Oct. 15, 2013.*

(Continued)

*Primary Examiner* — James Hulka
*Assistant Examiner* — John T Nolan (57) ABSTRACT

CMUT devices are used in many applications e.g. for ultrasound imaging and pressure measurement. These devices operate by sensing a change in capacitance caused by deflection of a membrane (32) comprising one of a pair of electrodes in the device by ultrasound exposure of or pressure applied on, the membrane. The CMUT device may be susceptible to the effects of changing temperature.

16 Claims, 5 Drawing Sheets

(56) References Cited

U.S. PATENT DOCUMENTS

| | | | |
|---|---|---|---|
| 2005/0200241 A1* | 9/2005 | Degertekin | G01N 29/2406 310/334 |
| 2005/0200242 A1 | 9/2005 | Degertekin | |
| 2008/0294055 A1* | 11/2008 | Adachi | B06B 1/0292 600/463 |
| 2010/0195851 A1* | 8/2010 | Buccafusca | H04R 17/02 381/190 |
| 2010/0207485 A1 | 8/2010 | Dirksen et al. | |
| 2010/0242612 A1 | 9/2010 | Sano et al. | |

FOREIGN PATENT DOCUMENTS

| | | |
|---|---|---|
| EP | 1974832 A2 | 10/2008 |
| GB | 2048488 A | 4/1979 |
| RU | 2010197 C1 | 3/1994 |
| WO | 2010032156 A2 | 3/2010 |

OTHER PUBLICATIONS

"The Temperature Compensation of the Silicon Piezo-Resistive Pressure Sensor Using the Half-Bridge Technique" Peng et al, Proceedings of SPIE vol. 5343.

"An Intelligent Pressure Sensor Using Neural Networks" Patra et al, IEEE Transactions on Instrumentation and Measurement, vol. 49, No. 4, Aug. 2000.

"Fabrication of MEMS Pressure Sensor for Lab Course E3-222" S. Vedavathi.

Design and Characterization of Temperature Robust Piezoresistive Micro-Pressure Sensor. Tsai et al, DTIP of MEMS and MOEMS 2009.

\* cited by examiner

TEMPERATURE COMPENSATION IN A CMUT DEVICE

CROSS-REFERENCE TO PRIOR APPLICATIONS

This application is a U.S. National Phase application under 35 U.S.C. §371 of International Application No. PCT/IB2012/051719, filed on Apr. 6, 2012, which claims the benefit of EP Patent Application No. 11162282.5, filed on Apr. 13, 2011. These applications are hereby incorporated by reference herein.

FIELD OF THE INVENTION

The invention relates to the field of CMUT devices, to the use of a CMUT device, and to a method of manufacture of a CMUT device. The invention further relates to a CMUT device comprising a silicon substrate, a cavity, and a membrane. The membrane and the silicon substrate each being arranged to form a side of the cavity, said sides being located opposite to each other. A first electrode arranged adjacent and parallel to the cavity, being arranged contiguous to the silicon substrate, and a second electrode arranged adjacent and parallel to the cavity, opposite to the first electrode, and being embedded in the membrane.

BACKGROUND TO THE INVENTION

A CMUT (capacitive micromachined ultrasound transducer) is a type of MEMS (Micro-Electro-Mechanical Systems) device. The CMUT utilizes electrical forces for the transducer effect. Construction is usually done by manufacturing the CMUT on a silicon substrate. A cavity is formed in the region of the substrate and a thin layer suspended across the cavity to form a membrane. Electrodes are placed at the membrane and at the substrate to form an electrode pair.

Vibration of the membrane can be triggered by applying pressure (for example using ultrasound) or can be induced electrically. Electrical connection to the CMUT, often by means of an ASIC (application specific integrated circuit) facilitates both transmission and reception modes of the device. In reception mode, changes in the membrane position cause changes in electrical capacitance, which can be registered electronically. In transmission mode, applying an electrical signal casses vibration of the membrane.

CMUT devices generally operate with a biasing voltage applied. The CMUT can be operated in so called collapsed mode where the biasing voltage applied is increased above the collapse voltage to restrict the membrane and confine it against the substrate. The frequency of operation of the CMUT device is characterised by the material and physical properties of the membrane, such as the stiffness, and the size of the cavity. The bias voltage and application of the CMUT device also influence the operation mode.

A CMUT is often used in devices for ultrasound imaging applications and in other applications where the CMUT is used to detect fluid or air pressures. A pressure causes a deflection of the membrane that is electronically sensed as a change of capacitance. A pressure reading can then be derived.

A problem with CMUT devices is that a temperature change may also be the root cause of membrane deflection. In reception mode, this gives an inaccurate reading of information derived from the CMUT device. In particular, such a problem can be very limiting for CMUT based pressure sensors used in medical devices. In transmission mode, this causes a reduced efficiency of the electrical to presure power (such as ultrasound waves) conversion

SUMMARY OF THE INVENTION

It is an object of the present invention to overcome the above problem of temperature sensitivity of a CMUT device.

This object is achieved according to the invention by provision of a CMUT device further comprising a temperature compensation means, such means being arranged to reduce a temperature induced deflection of the membrane by minimizing a thermally induced momentum of the membrane.

CMUT devices show a trend towards higher capacitance measurement at higher temperatures. Thus in the example of a pressure measurement by a CMUT, the fixed pressure to be measured would correspond to a lower capacitance in the device at a lower temperature than if the same device was operating in a higher temperature regime. Or to put it another way, capacitance in the CMUT device would register as an apparently lower pressure reading at the higher temperature.

To a good approximation, this physical relation may be described as a linear effect according to:

$$P = P_0 + \beta T$$

where P is the apparent pressure, $P_0$ is the actual pressure, T is the temperature, and $\beta$ is a coefficient relating to the change in pressure due to the temperature change.

Such a coefficient, once known, allows characterization and correction of the pressure data at different temperatures for an individual CMUT device.

The inventors of the present application have realized that the root cause of the temperature variation effects stem from the design and characteristics of the materials making up the membrane. Usually the CMUT device incorporates an electrode (here labeled as the second electrode) into its membrane. The electrode is made from an electrically conductive material which is different from the material of the membrane itself. Under the influence of temperature change, the two materials expand or contract at different rates and with different expansion characteristics. This creates stresses and momentums within the membrane region which trigger movements in the membrane thereby stimulating changes in capacitance. By means of the invention, the effect of thermally induced forces on and/or momentums in the membrane are minimized, such that a much lower thermal induced deflection of the membrane results.

In a further embodiment of the invention, the deflection of a rotationally symmetrical membrane has been modeled according to:

$$h = \frac{M}{2 \cdot D} r_b^2 \log\left(\frac{r_m}{r_b}\right), \quad \text{Equation 1}$$

with $$D = \frac{E \cdot h_3^3}{12 \cdot (1 - v^2)},$$

$$M = S \cdot ((h_2 - 0.5 \ h_3)^2 - (h_1 - 0.5 \ h_3)^2)$$

$$S = (\alpha_1 \cdot E_1 - \alpha_2 \cdot E_2) \cdot \Delta T$$

where h is the temperature induced deflection of the membrane towards the substrate at a centre point of the cavity, M is the thermally induced momentum of the membrane, D is the flexural rigidity of a plate, $r_m$ is a radius of the membrane as defined from the centre point of the cavity, $r_b$ is a radius of the second electrode as defined from the centre point of the cavity, $h_1$, $h_2$ and $h_3$ are the distances of a first side of the second electrode, a second side of the second electrode and the thickness of the membrane, respectively, as measured from the side of the membrane forming the side of the cavity, v is the Poisson ratio, S is the thermal stress in the membrane, E is Young's modulus for the material of the membrane, $E_1$ and $E_2$ relating to the second electrode and the membrane, respectively, ΔT is a temperature change, and α is a expansion coefficient of a material, $α_1$ and $α_2$ relating to the second electrode and the membrane, respectively.

The temperature compensation means of the invention are arranged to reduce the temperature induced deflection of the membrane, h, by control of the various parameters, involved in the relation above, in the design of the CMUT. The temperature compensation means thus comprise several different embodiments of the invention which are described in terms of the physical characteristics of the CMUT devices which result from manipulation of a particular parameter or parameters triggering a membrane deflection.

The embodiments of the invention device laid out below can be implemented singly or in combination, as desired.

The formula above is described in terms of a rotationally symmetric CMUT device, in particular a CMUT device where the membrane and second electrode are approximately circular in shape. Hence the use of the radii to describe dimensions associated with the membrane and electrodes. The concept of the invention could also be applied to devices where the symmetry is basically circular but where the CMUT and/or CMUT components do not have fully circular symmetry but are shaped in the form of an n-polygon, e.g. an octagon.

In the case of CMUTs with e.g. membrane and electrode in the shape of a rectangle, the concept of the invention can still be applied by the conversion of the radius parameter, r, to a single axial parameter defined along the long or short axis of the rectangle e.g. in a defined x direction. The x parameter may then be substituted as an approximation for the r parameter in Equation 1 above.

In a further embodiment of the invention, the second electrode is arranged symmetrically with respect to the membrane height, such that $(h_1+h_2)/2$ is equal, or approximately equal, to ½ $h_3$, thereby reducing M towards 0.

The second electrode is often positioned in the membrane closer to the cavity than to the top of the membrane. This gives greater measurement sensitivity in the device.

Placement of the second electrode according to this embodiment of the invention gives a symmetry to the position of the second electrode within the membrane thereby equalizing the momentum and forces built up as the material distribution is equalized.

In a further embodiment of the invention, the thickness of the second electrode is reduced and the position of the second electrode is offset with respect to a central axis of the membrane parallel to the cavity.

The momentum in the membrane can then be represented as $$M=2Sδz,$$

where M is the thermally induced momentum of the membrane,

S is the thermal stress in the membrane,

δ is the thickness of the second electrode $(=h_2-h_1)$, and z is the distance of the second electrode from the central axis of the membrane parallel to the cavity to the adjacent surface of the second electrode.

The thickness of the second electrode cannot be continuously reduced due to processing considerations during the manufacture of the CMUT. However, the effect on momentum scales linearly with the thickness of the second electrode and is beneficial in the reduction of temperature effects.

In further embodiments of the invention, the second electrode extends across the entire membrane parallel to the cavity, particularly such that $r_b=r_m$.

In this embodiment the electrode covers the entire membrane and both the electrode and the membrane are fixed at an anchor point. This is suitable for applications where a high sensitivity in the device is not so critical.

In a further embodiment of the invention, the CMUT device further comprises a first compensating plate, the first compensating plate being composed of the same material as the second electrode, and being located on an outer surface of the membrane opposite to the cavity, on a side parallel to the cavity, the plate having a radius $r_{b\text{-}top}$ as measured from the centre point of the cavity such that $r_{b\text{-}top} \leq r_b$.

In a further embodiment of the invention, the CMUT device further comprises a second compensating plate, the second compensating plate being arranged to the dimensions and composition of the second electrode, the second compensating plate and second electrode being positioned symmetrically in the membrane with respect to a central axis of the membrane and parallel to the cavity.

The centre axis of the membrane, parallel to the cavity, can be envisaged as a kind of line or axis of symmetry. Temperature effects in electrodes or plates placed on either side of this line compensate each other because their temperature effects are opposite.

A first compensating plate can be used to balance the temperature effect of the second electrode when it is placed on the surface of the membrane opposite to the cavity—essentially the "top" surface. Such a plate is at a distance from the centre axis of the membrane different from the second electrode distance. The moments generated by the two components under thermal stress should be opposite in effect and should balance. This is achieved by the alteration of the radius of the first compensating plate with respect to the second electrode. The radius of the first compensating plate is designed smaller than that of the second electrode. This embodiment has an advantage in that the first compensating plate can be added to an existing CMUT device. The first compensating plate does not require a redesign of the CMUT to be implemented. Further, this solution is relatively easy to process in terms of ease with respect to other processing steps.

Alternatively if the radius of the first compensating plate is equal to the radius of the second electrode, a compensation can be made by effecting changes to the thickness of the first compensating plate. For example, a first compensating layer of aluminum may be made thinner than a second electrode, also fabricated from aluminum, when both have the same radius value.

In a further step, a thin passivation layer, e.g. 100 nm nitride, may cover the first compensating plate to protect it against the environment.

Alternatively, a second compensating plate may be implemented. This second plate is of the same material and dimensions as the second electrode, and the CMUT device is designed so that both the second compensating plate and the second electrode are distanced symmetrically from the central axis of the membrane.

In a further embodiment of the invention, the CMUT device second electrode comprising a narrow ring arranged to separate and electrically disconnect an inner portion of the second electrode from an outer portion.

This embodiment of the invention comprises a second electrode which extends to an anchor point together with the membrane. The second electrode comprises a narrow ring (or a gap in the case of a rectangular, non-circularly symmetric electrode). This narrow ring or gap electrically disconnects the inner part of the second electrode from an outer part. The position of the ring or gap can be optimized such that the radial position of the optimal position of the ring, r, (or equivalent gap parameter) is given by $r=r_m/\sqrt{e}$.

In a further special embodiment of the invention, the first compensating plate may have a radius larger than the radius of the second electrode. This is to allow for further compensations due to the thickness (tolerences) of the first compensating plate during manufacture.

In a further embodiment of the device, the membrane comprises silicon nitride and the second electrode comprises aluminum or an aluminum compound.

These materials have been proven to be very suitable for the manufacturing processes used to produce a CMUT and for the performance of the device. Ease of manufacturing is extremely important. In terms of thermal expansion, however, these materials behave in very different ways under temperature variation. In Equation 1, $S=\alpha E$ for silicon nitride has a value of 573, whereas that of Al is 1610. The materials don't match. An alternative to assist the temperature performance would be to use materials for the membrane and electrode which match better thermally. However, materials such as Cu, W and Mo, commonly used in processing do not give an advantage in this respect, having S values of 1980, 1850 and 1579, respectively.

The embodiments of the invention can be extended by association of the CMUT device with a dedicated ASIC. The ASIC is dependent on the application for which the CMUT is to be used. In applications where the size of the CMUT is critical, such as pressure sensing inside a vessel in the body e.g. blood pressure in vessels around the heart, a CMUT integrated with an ASIC saves space and adds functionality to the device.

A CMUT device according to the invention can be used in a variety of applications. Particularly suitable applications are ultrasound imaging and pressure sensing, where the temperature dependency can be a critical factor in the reliability of the information obtained via the CMUT device.

Another aspect of the invention comprises a method of manufacturing a CMUT device according to the invention.

Such a method comprises the steps of
making the CMUT device according to any of claims 1 to 11,
providing a test facility for the CMUT device, the test facility being capable of being driven through a range of temperatures,
measuring a temperature dependence of the CMUT device.

The manufacturing processes to make a CMUT device according to the invention can be standard manufacturing processes. No special materials or special processing requirements are needed, with the exception of possible additional (conventional) steps to fabricate a pattern or specific layer in the device. The CMUT device according to the invention is intended to be temperature insensitive so far as possible. This new parameter is important to the functioning of the device and to the target applications of the device. Thus a testing step in the manufacturing process, wherein the temperature sensitivity of the CMUT is ascertained, is an important aspect of utilizing the invention. Depending on the target application for the CMUT device, the temperature range to be tested can be determined. Standard conventional testing bays can cover a temperature range of at least −55° C. to +200° C. However for medical applications, +10° C. to +60° C. is a more relevant and critical temperature range, falling in the area around normal body temperature parameters, and incorporating procedural steps which may involve the introduction of treatment substances into the body at a different temperature in the area in which the CMUT device is operating.

The temperature dependence of a CMUT device according to the invention may be characterized by a coefficient β. This can be used as a quality parameter for the CMUT device. A further first compensating plate may be added to the device for further temperature compensation by additional processing.

If an ASIC is present in association with the CMUT device, known marking techniques can be used to mark the ASIC with an identifier and/or a record of the temperature dependence coefficient for that device. This may be particularly important in medical applications where traceability is highly important and sometimes mandatory.

The ASIC may also be provided with a temperature sensor on the circuit. This temperature signal can be used for fine calibration and correction of the pressure reading. An additional option relates to a thermodilution technique where a cold fluid, such as saline, is injected into the vessels near the heart. Down-stream in the blood flow the temperature profile (the time dependent temperature) is measured. The particular temperature profile in time is a measure for the flow rate. The temperature sensor could be used to facilitate this measurement.

BRIEF DESCRIPTION OF THE DRAWINGS

The invention will now further be elucidated with respect to the figures:

FIG. 2 illustrates the temperature sensitivity advantage according to the invention for a CMUT device used for pressure measurement.

FIG. 4 illustrates a CMUT device according to an aspect of the invention wherein FIG. 4a shows a mask layout suitable for adding an additional compensating layer, the CMUT device patterning having the option of provision of an additional combined ASIC, and wherein

DETAILED DESCRIPTION OF PREFERRED EMBODIMENTS

Figure 1:
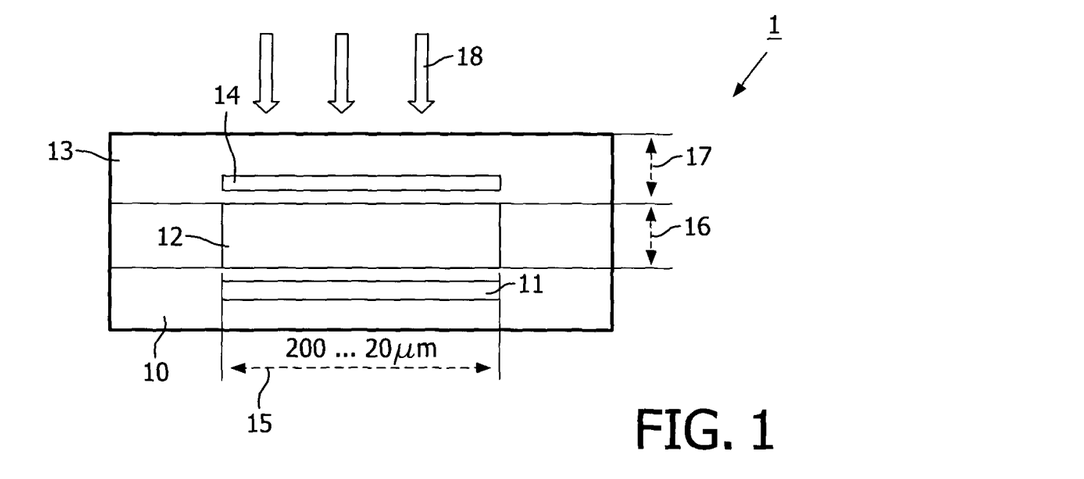
FIG. 1 illustrates schematically a prior art CMUT device.

FIG. 1 illustrates a simplified example of a prior art CMUT device. In this example the CMUT is acting as a pressure sensor, but it should be noted that the CMUT device of the invention is not limited to this application. The drawing has been simplified to explain the features most relevant to the understanding of the invention. If should be noted that the CMUT device may comprise other features or layers or layer stacks, as necessary for the processing and electrical operation of the device. The external connections to a possible associated ASIC or any other connections to the outside environment are not shown here.

The basic CMUT is founded on a silicon substrate 10. This silicon substrate 10 is provided with a first electrode 11, commonly known as the bottom electrode, which may be directly in contact with the silicon substrate 10 or may be arranged close to the silicon substrate 10 but separated by some other base processing layers. A cavity 12 is provided—this cavity is normally kept at low pressure close to vacuum and provides a space between the silicon substrate 10 and a silicon nitride membrane 13. The silicon nitride membrane 13 may also be biased into a so-called "collapsed" mode, in which instance the membrane may be in contact with the silicon substrate 10 due to the application of an applied voltage. The silicon nitride membrane 13 has a second electrode 14 embedded in it. This second electrode 14 forms an electrode pair with the first electrode 11 and is commonly known as the "top" electrode. The capacitive effect of the CMUT comes from the provision of these two electrodes 11 and 14. A common length value of the electrodes 11 and 14 as indicated by arrow 15 is 200 nm to 20 µm. The electrodes 11 and 14 are generally manufactured to be of similar length. A typical height of the vacuum cavity 12 is around 0.5 µm, as indicated by arrow 16. A typical height of the silicon nitride membrane 13 is around 1 µm, as indicated by arrow 17. In operation, the silicon nitride membrane 13 experiences a pressure, as indicated by arrow 18, which causes the silicon nitride membrane 13 to flex. The change in position of the silicon nitride membrane 13 causes a change in distance between the first and second electrodes 11 and 14, thereby changing a capacitance established between them. This change in capacitance is detected and converted into a pressure measurement change.

Figure 2A:
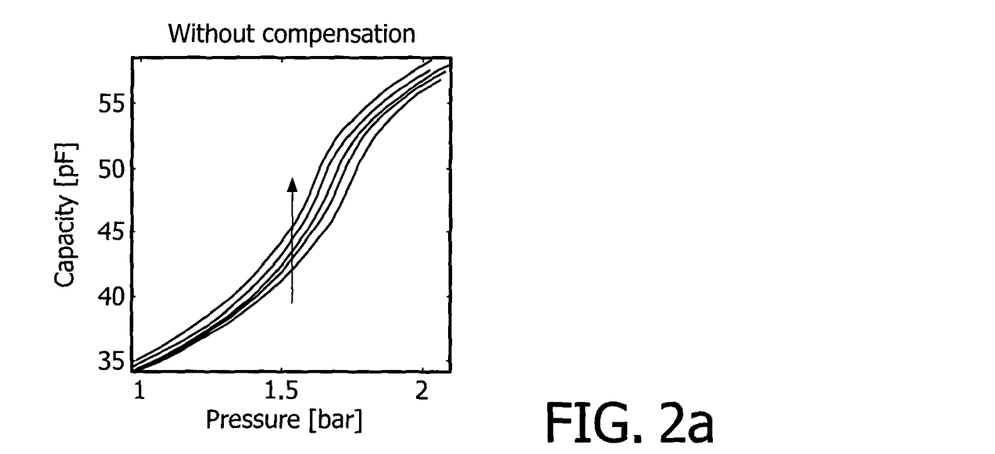
FIG. 2a shows capacity versus pressure for a prior art CMUT.
Figure 2B:
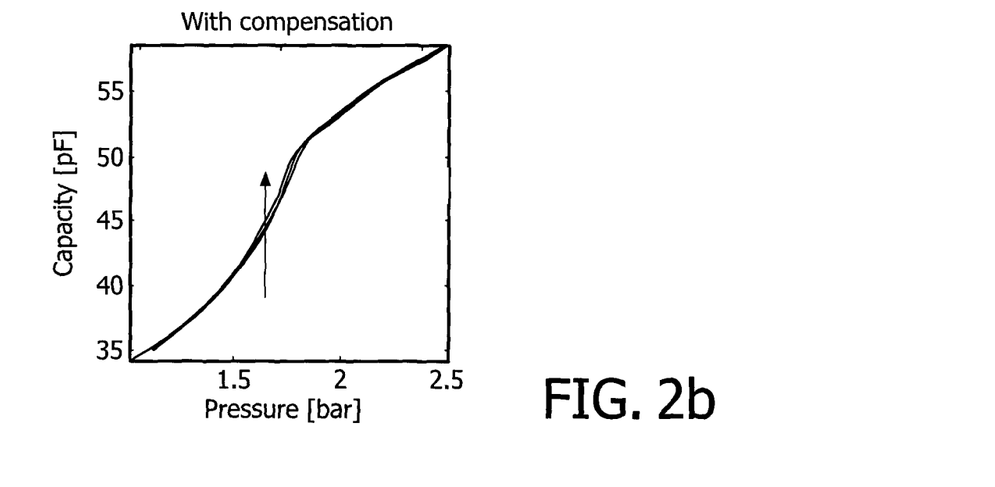
FIG. 2b shows capacity versus pressure for a CMUT according to the invention.

FIG. 2a illustrates how capacity (capacitance) of a prior art CMUT device is related to a measurement of pressure. The different graph lines indicate the relationship at different temperatures, temperature increasing in the direction of the arrow. It is clear from the figure that a certain capacitance of the CMUT will be indicative of different pressures depending on the temperature, thereby making the pressure readings temperature sensitive. FIG. 2b illustrates the same experiment effected using a CMUT according to the invention for the same range of temperatures. The CMUT has been fitted with a first compensating plate according to the invention, where a layer of material similar to the second electrode present in the membrane of the CMUT has been applied on top of the membrane such that the thermal and mechanical effects of this first compensating plate act to adjust for the thermal and mechanical effects of the second electrode when the CMUT is subjected to changes in temperature. The CMUT according to the invention can be seen to be temperature insensitive. The data obtained are supported by computer simulations.

FIG. 3 depicts a section of a CMUT device 30 according to the invention, with different aspects of the invention illustrated in different figures. The different figures of FIG. 3 contain consistent numbering for clarity. Arrow 31 illustrates that this particular CMUT device has circular symmetry. The sections of the CMUT device in FIG. 3 concentrate on the membrane 32 and the second electrode 33. An anchor point for the membrane 34 is also shown.

Figure 3A:
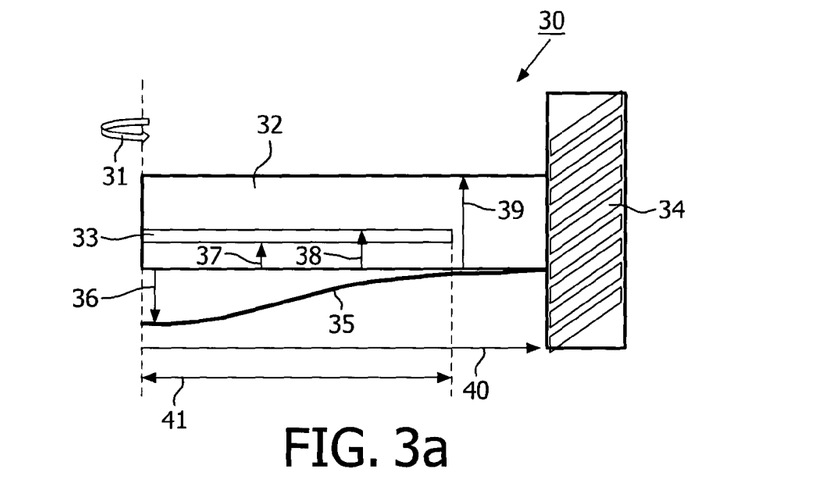
FIG. 3 parts a to i, illustrates different aspects and features of a CMUT device according to the invention.

The basic figure is FIG. 3a. This figure is related to Equation 1 of the description to depict some of the parameters therein. FIG. 3a illustrates a deflection of the membrane by means of the line marked 35. Arrow 36 indicates the term, h, in Equation 1. Pictorial representations of terms $h_1$, $h_2$, and $h_3$ are given by arrows 37, 38 and 39, respectively, and represent the distance from the bottom of the membrane to the bottom of the second electrode, the top of the second electrode and the thickness of the membrane. The radius of the membrane and second electrode are indicated by arrows 40 and 41, respectively. The radii are taken from the centre point of the membrane at the axis of rotation and symmetry 31.

Figure 3B:
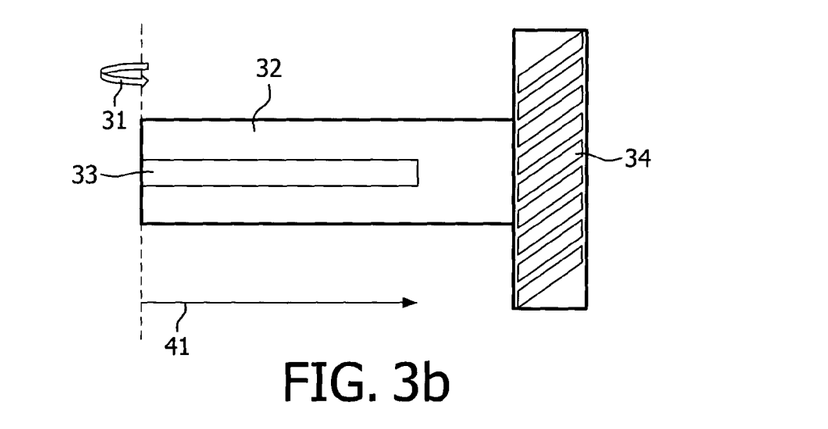

FIG. 3b illustrates an aspect of the invention. Here the second electrode 33 is placed symmetrically within the membrane.

Figure 3C:
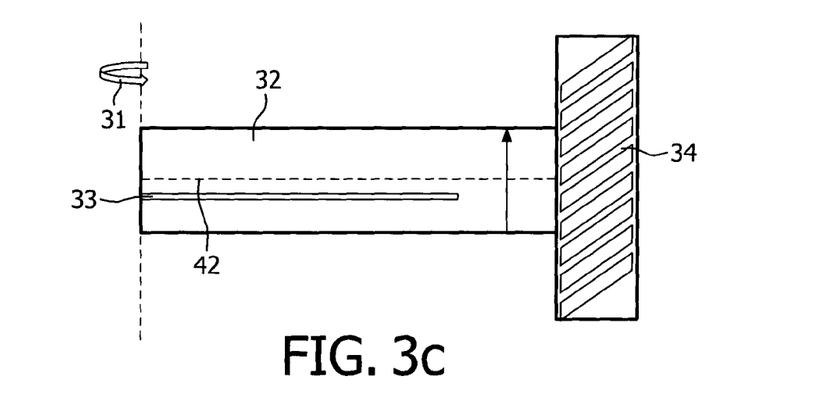

FIG. 3c illustrates a further aspect of the invention. In this case the second electrode 33 is made thinner than normal and is positioned offset from a central lateral membrane axis 42.

Figure 3D:
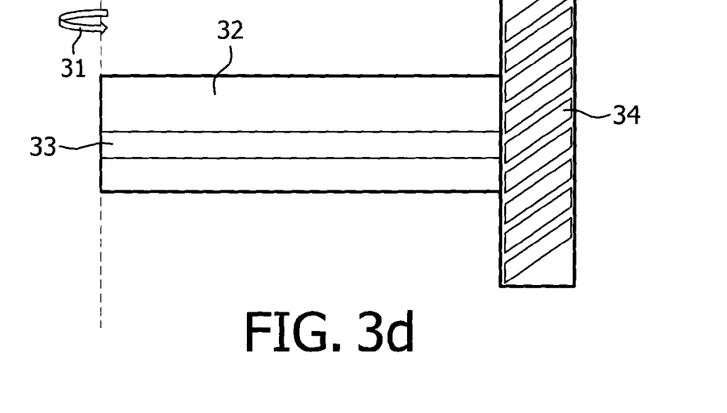

FIG. 3d illustrates a further aspect of the invention. Here the second electrode 33 extends through the entire diameter of the membrane 32 such that the radius of the membrane 32 is the same as the radius of the second electrode 33.

Figure 3E:
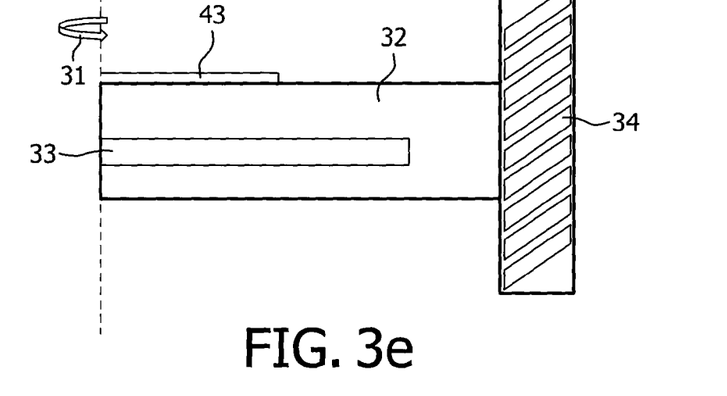
Figure 3F:
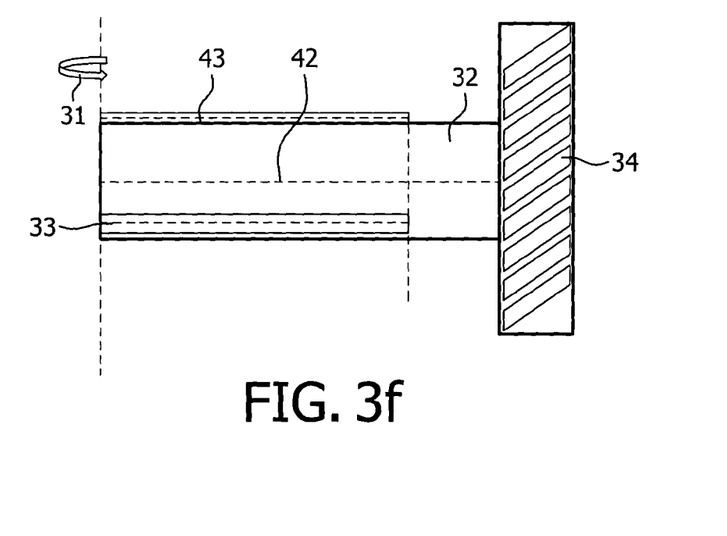
Figure 3G:
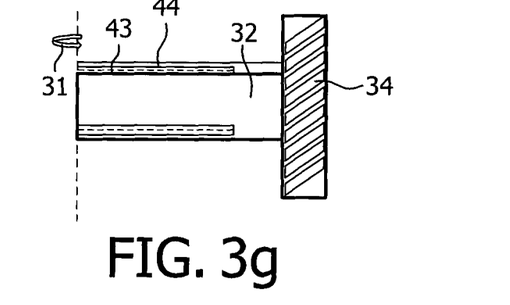

FIGS. 3e to 3g illustrates a further aspect of the invention. In this scenario a first compensating plate 43 is located on top of the membrane 32. The radius of the first compensating plate 43 ($r_{b\text{-}top}$) and the position of the first compensating plate 43 with respect to a central lateral membrane axis 42 and to the position of the second electrode 33 can be varied to produce different compensation effects. FIG. 3g illustrates the situation where a passivation layer 44 may be provided as protection for the first compensating plate 43 against the environment.

Figure 3H:
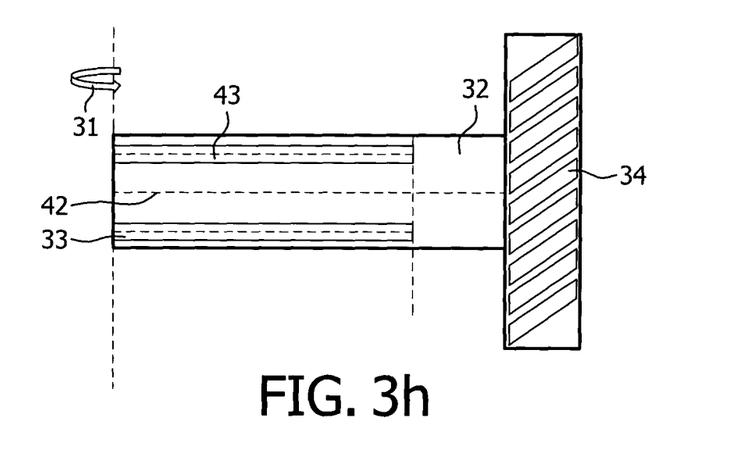

FIG. 3h illustrates a special case where a symmetrical arrangement of the first compensating plate 43 with the second electrode 33 is arranged around the central lateral membrane axis 42.

Figure 3I:
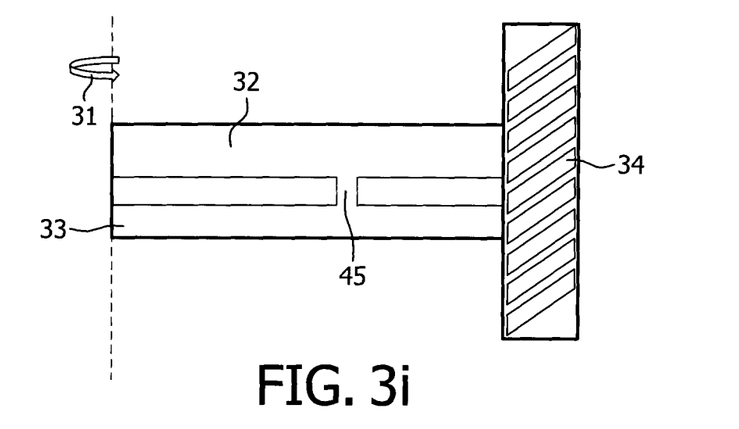

FIG. 3i illustrates a further aspect of the invention. Here the second electrode 33 is provided with a gap, here illustrated at the optimal gap position in the radius 45.

Figure 4A:
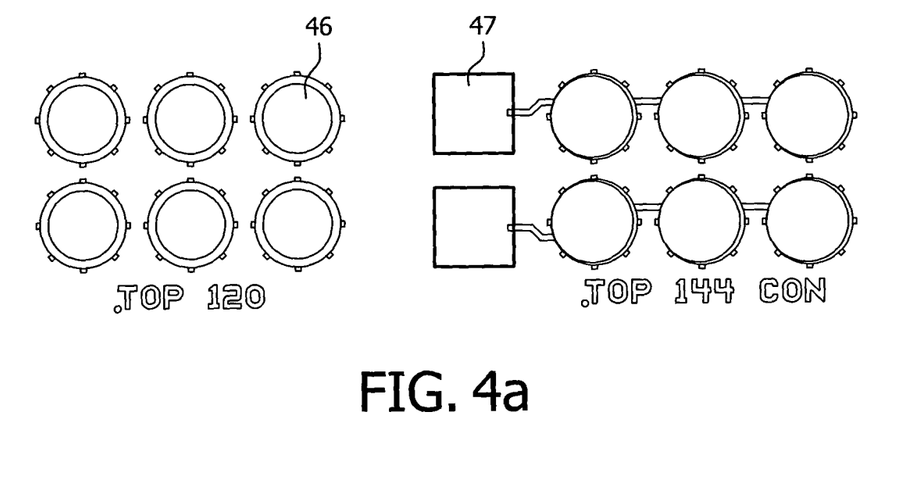
Figure 4B:
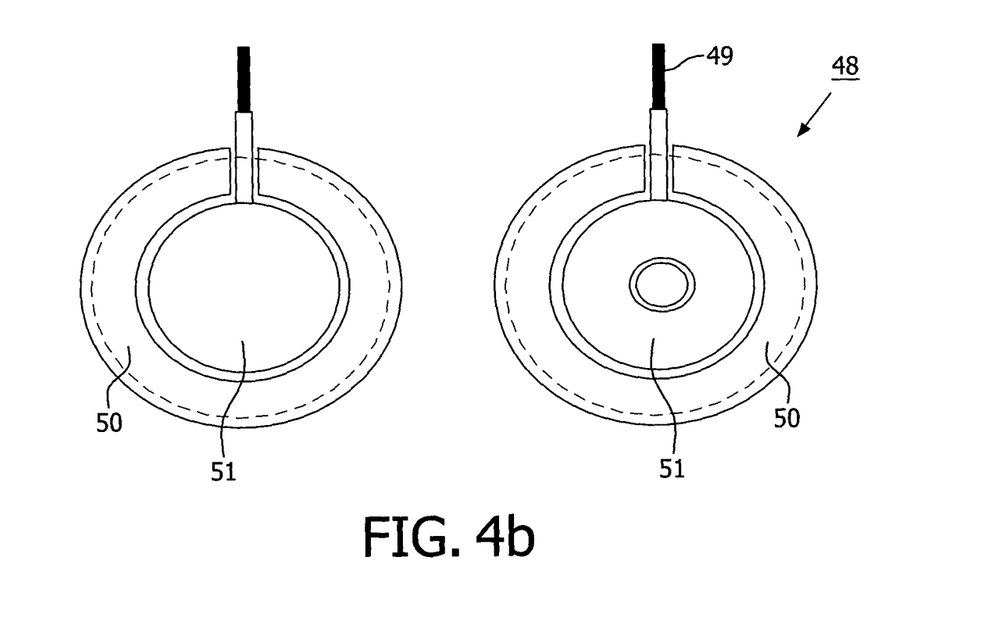
FIG. 4b shows a CMUT device patterned using such a mask at a subsequent stage of manufacture.

FIG. 4 shows a top view of a mask (FIG. 4a) and devices (FIG. 4b) associated with an aspect of the invention where a first compensating plate 43 is provided as the solution to thermal sensitivity. In FIG. 4a the CMUT device layer 46 is shown, with some components having the option of an associated ASIC 47. FIG. 4b shows a top down view of the device, with associated connection to an ASIC 49 with a split second electrode 33 which has an outer 50 and inner 51 part.

LIST OF REFERENCE NUMERALS

1 CMUT device
10 silicon substrate

11 First electrode
12 cavity
13 silicon nitride membrane
14 second electrode
15 arrow
16 arrow
17 arrow
18 arrow
30 section of a CMUT device according to the invention
31 arrow
32 membrane
34 anchor point for membrane
35 indication of membrane deflection
36 to 41 arrows
42 central lateral membrane axis
43 first compensating plate
44 passivation layer
45 optimal gap position
46 CMUT device layer
47 ASIC
48 CMUT device
49 connection to ASIC
50 outer part second electrode
51 inner part second electrode

The invention claimed is:

1. A CMUT device comprising,
a silicon substrate,
a cavity,
a membrane,
the membrane and the silicon substrate each being arranged to form sides of the cavity, said sides being located opposite to each other,
a first electrode arranged adjacent and parallel to the cavity, and being arranged contiguous to the silicon substrate, and
a second electrode arranged adjacent and parallel to the cavity, opposite to the first electrode and being embedded in the membrane,
wherein the CMUT device is adapted to reduce a temperature induced deflection of the membrane, h, according to:

$$h = \frac{M}{2 \cdot D} r_b^2 \log\left(\frac{r_m}{r_b}\right), \text{ with}$$

$$D = \frac{E \cdot h_3^3}{12 \cdot (1 - v^2)},$$

$$M = S \cdot ((h_2 - 0.5h_3)^2 - (h_1 - 0.5h_3)^2)$$

$$S = (\alpha_1 \cdot E_1 - \alpha_2 \cdot E_2) \cdot \Delta T$$

where
h is the temperature induced deflection of the membrane towards the substrate at a centre point of the cavity, s
M is the thermally induced momentum of the membrane,
D is the flexural rigidity of a plate,
$r_m$ is a radius of the membrane as defined from the centre point of the cavity,
$r_b$ is a radius of the second electrode as defined from the centre point of the cavity,
$h_1$, $h_2$, and $h_3$ are the distances of a first side of the second electrode, a second side of the second electrode and a thickness of the membrane, respectively, as measured from the side of the membrane forming the side of the cavity,
v is the Poisson ratio,
S is the thermal stress in the membrane,
E is Young's modulus for the material of the membrane,
$E_1$ and $E_2$ relating to the membrane and the second electrode, respectively,
$\Delta T$ is a temperature change, and
$\alpha$ is an expansion coefficient of a material, $\alpha_1$ and $\alpha_2$ relating to the membrane and the second electrode, respectively, wherein the thermally induced momentum of the membrane is minimized.

2. The CMUT device according to claim 1, wherein a position of the second electrode is offset with respect to a central axis of the membrane parallel to the cavity and a thickness of the second electrode in the position offset with respect to the central axis is less than a thickness of the second electrode when it is positioned at the central axis.

3. The CMUT device according to claim 1, wherein the second electrode extends across the entire membrane parallel to the cavity.

4. The CMUT device according to claim 3, wherein $r_b = r_m$ where $r_m$ is a radius of the membrane as defined from the centre point of the cavity, and $r_b$ is a radius of the second electrode as defined from the centre point of the cavity.

5. The CMUT device according to claim 1, wherein the CMUT device further comprises a first compensating plate comprising the same material as the second electrode, and being located on an outer surface of the membrane opposite to the cavity and parallel to the cavity, the plate having a radius $r_{b\text{-}top}$ as measured from the centre point of the cavity such that $r_{b\text{-}top} \leq r_b$, where $r_b$ is a radius of the second electrode as defined from the centre point of the cavity.

6. The CMUT device according to claim 5, wherein the CMUT device further comprises a second compensating plate, the second compensating plate having the same dimensions and composition of the second electrode, the second compensating plate and second electrode being positioned symmetrically in the membrane with respect to a central axis of the membrane and parallel to the cavity.

7. The CMUT device according to claim 1, the second electrode comprising a narrow ring arranged to separate and electrically disconnect an inner portion of the second electrode from an outer portion of the second electrode.

8. The CMUT device according to claim 1, wherein the membrane comprises silicon nitride and the second electrode comprises aluminum or an aluminum compound.

9. The CMUT device according to claim 1, further comprising a dedicated ASIC, the ASIC being an independent component or being integrated with the CMUT.

10. An ultrasound imaging device comprising a CMUT device according to claim 1.

11. A pressure sensing device comprising a CMUT device according to claim 1.

12. A CMUT device comprising,
a silicon substrate,
a cavity,
a membrane,
the membrane and the silicon substrate each being arranged to form sides of the cavity, said sides being located opposite to each other,
a first electrode arranged adjacent and parallel to the cavity, and being arranged contiguous to the silicon substrate, and
a second electrode arranged adjacent and parallel to the cavity, opposite to the first electrode and being embedded in the membrane, wherein the second electrode is arranged symmetrically with respect to the membrane height, such that $(h_1+h_2)/2$ is equal, or approximately equal, to $\frac{1}{2} h_3$, thereby reducing M towards 0, where $h_1$, $h_2$ and $h_3$ are the distances of a first side of the second electrode, a second side of the second electrode and the thickness of the membrane, respectively, as measured from the side of the membrane forming the side of the cavity, and M is the thermally induced momentum of the membrane, wherein the CMUT device is adapted to reduce a temperature induced deflection of the membrane, h, wherein the thermally induced momentum of the membrane is minimized.

13. A method of manufacturing a CMUT device, the method comprising the steps of:
  making a CMUT device comprising a silicon substrate, a cavity, a membrane, the membrane and the silicon substrate each being arranged to form sides of the cavity, said sides being located opposite to each other, a first electrode arranged adjacent and parallel to the cavity, and being arranged contiguous to the silicon substrate, and a second electrode arranged adjacent and parallel to the cavity, opposite to the first electrode and being embedded in the membrane, wherein the CMUT device is adapted to reduce a temperature induced deflection of the membrane through design characteristics of the membrane, wherein the design characteristics of the membrane result in minimizing a thermally induced momentum of the membrane,
  adding a first, or an additional first, compensating plate, said compensating plate being composed of the same material as the second electrode, and being located on an outer surface of the membrane opposite to the cavity, on a side parallel to the cavity, the plate having a radius $r_{b\text{-}top}$ as measured from the centre point of the cavity such that $r_{b\text{-}top} \leq r_b$, where $r_b$ is a radius of the second electrode as defined from the centre point of the cavity,
  providing a test facility for the CMUT device, the test facility being capable of being driven through a range of temperatures, and
  measuring a temperature dependence of the CMUT device.

14. The method according to claim 13 comprising the additional step of:
  adding a permanent record of the measured temperature dependence of the CMUT device, and/or a unique identifier, to the ASIC.

15. The method of claim 13, wherein the range of temperatures comprises a temperature range of at least −55° C. to +200° C.

16. The method of claim 13, wherein the range of temperatures comprises a temperature range of +10° C. to +60° C.

* * * * *